United States Patent
Komori

(10) Patent No.: US 12,018,368 B2
(45) Date of Patent: Jun. 25, 2024

(54) POWDER TRANSFER APPARATUS, GAS SUPPLY APPARATUS, AND POWDER REMOVAL METHOD

(71) Applicant: Tokyo Electron Limited, Tokyo (JP)

(72) Inventor: Eiichi Komori, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 139 days.

(21) Appl. No.: 17/648,337

(22) Filed: Jan. 19, 2022

(65) Prior Publication Data
US 2022/0243321 A1 Aug. 4, 2022

(30) Foreign Application Priority Data
Feb. 2, 2021 (JP) .................................. 2021-015299

(51) Int. Cl.
| C23C 16/448 | (2006.01) |
| C23C 16/44 | (2006.01) |
| C23C 16/52 | (2006.01) |

(52) U.S. Cl.
CPC ........ C23C 16/448 (2013.01); C23C 16/4408 (2013.01); C23C 16/52 (2013.01)

(58) Field of Classification Search
CPC .............. C23C 16/45561; C23C 16/52; C23C 16/4481; C23C 16/448
See application file for complete search history.

(56) References Cited

U.S. PATENT DOCUMENTS

| 4,613,259 | A | * | 9/1986 | Packer | .................. B05B 7/1404 |
| | | | | | 406/14 |
| 2006/0086319 | A1 | * | 4/2006 | Kasai | ................ C23C 16/45565 |
| | | | | | 156/345.33 |
| 2007/0056509 | A1 | * | 3/2007 | Barbezat | ............... B05B 7/1404 |
| | | | | | 118/308 |
| 2009/0145358 | A1 | * | 6/2009 | Lee | ......................... C23C 14/12 |
| | | | | | 222/630 |
| 2010/0136230 | A1 | * | 6/2010 | Moriya | ............... C23C 16/4402 |
| | | | | | 118/58 |

FOREIGN PATENT DOCUMENTS

| JP | 2002-208564 | 7/2002 |
| JP | 2008-251905 | 10/2008 |
| JP | 2016-089885 | 5/2016 |
| JP | 2020-180354 | 11/2020 |
| KR | 10-2008-0111124 | 12/2008 |

* cited by examiner

Primary Examiner — Joseph A Miller, Jr.
(74) Attorney, Agent, or Firm — IPUSA, PLLC

(57) ABSTRACT

A powder transfer apparatus includes: a powder transfer pipe connecting a powder raw material supply source to a vaporizer and configured to supply a powder to the vaporizer from the powder raw material supply source; a first purge gas supply pipe connecting a buffer tank to the powder transfer pipe at a first branch point and configured to supply a purge gas from the buffer tank to the powder transfer pipe; a first valve that is closer to the powder raw material supply source than the first branch point is; a second valve that is closer to the vaporizer than the first branch point is, an opening degree of the second valve being adjustable; a first purge gas valve provided on the first purge gas supply pipe; and a controller configured to control opening and closing of the first valve, the second valve, and the first purge gas valve.

5 Claims, 13 Drawing Sheets

POWDER TRANSFER APPARATUS, GAS SUPPLY APPARATUS, AND POWDER REMOVAL METHOD

CROSS-REFERENCE TO RELATED APPLICATION

The present application is based upon and claims priority to Japanese Patent Application No. 2021-015299, filed on Feb. 2, 2021, and the entire contents of this application is incorporated herein by reference.

BACKGROUND

1. Field

The present disclosure relates to a powder transfer apparatus, a gas supply apparatus, and a powder removal method.

2. Background Art

A substrate processing system that vaporizes a solid raw material and supplies a raw material gas to a deposition processing apparatus is known.

Patent Document 1 describes a substrate processing system including a powdery source supply system and a film forming processing unit. The powdery source supply system includes an ampoule for accommodating a powdery source, a carrier gas supply unit for supplying a carrier gas into the ampoule, an introduction line for connecting the ampoule and the film forming processing unit, a purge line branched from the introduction line, and a valve for opening or closing the introduction line. When the valve is opened and the interior of the purge line is evacuated prior to the film forming process, the carrier gas supply unit supplies a carrier gas so that the viscous force by the carrier gas is greater than the viscous force in the film forming process.

Also, Patent Document 2 describes a diaphragm valve used for a fluid pipeline.

PRIOR ART DOCUMENTS

Patent Documents

[Patent Document 1] Japanese Laid-open Patent Publication No. 2008-251905
[Patent Document 2] Japanese Laid-open Patent Publication No. 2016-89885

In one aspect, the present disclosure provides a powder transfer apparatus, a gas supply apparatus, and a powder removal method to suppress internal leakage.

SUMMARY

In view of the above, according to one aspect, a powder transfer apparatus includes: a powder transfer pipe connecting a powder raw material supply source to a vaporizer and configured to supply a powder from the powder raw material supply source to the vaporizer; a first purge gas supply pipe connecting a buffer tank to the powder transfer pipe at a first branch point and configured to supply a purge gas from the buffer tank to the powder transfer pipe; a first valve that is closer to the powder raw material supply source than the first branch point of the powder transfer pipe is; a second valve that is closer to the vaporizer than the first branch point of the powder transfer pipe is, an opening degree of the second valve being adjustable; a first purge gas valve provided on the first purge gas supply pipe; and a controller configured to control opening and closing of the first valve, the second valve, and the first purge gas valve.

According to one aspect, it is possible to provide a powder transfer apparatus, a gas supply apparatus, and a powder removal method to suppress internal leakage.

DESCRIPTION OF THE EMBODIMENTS

Figure 1:
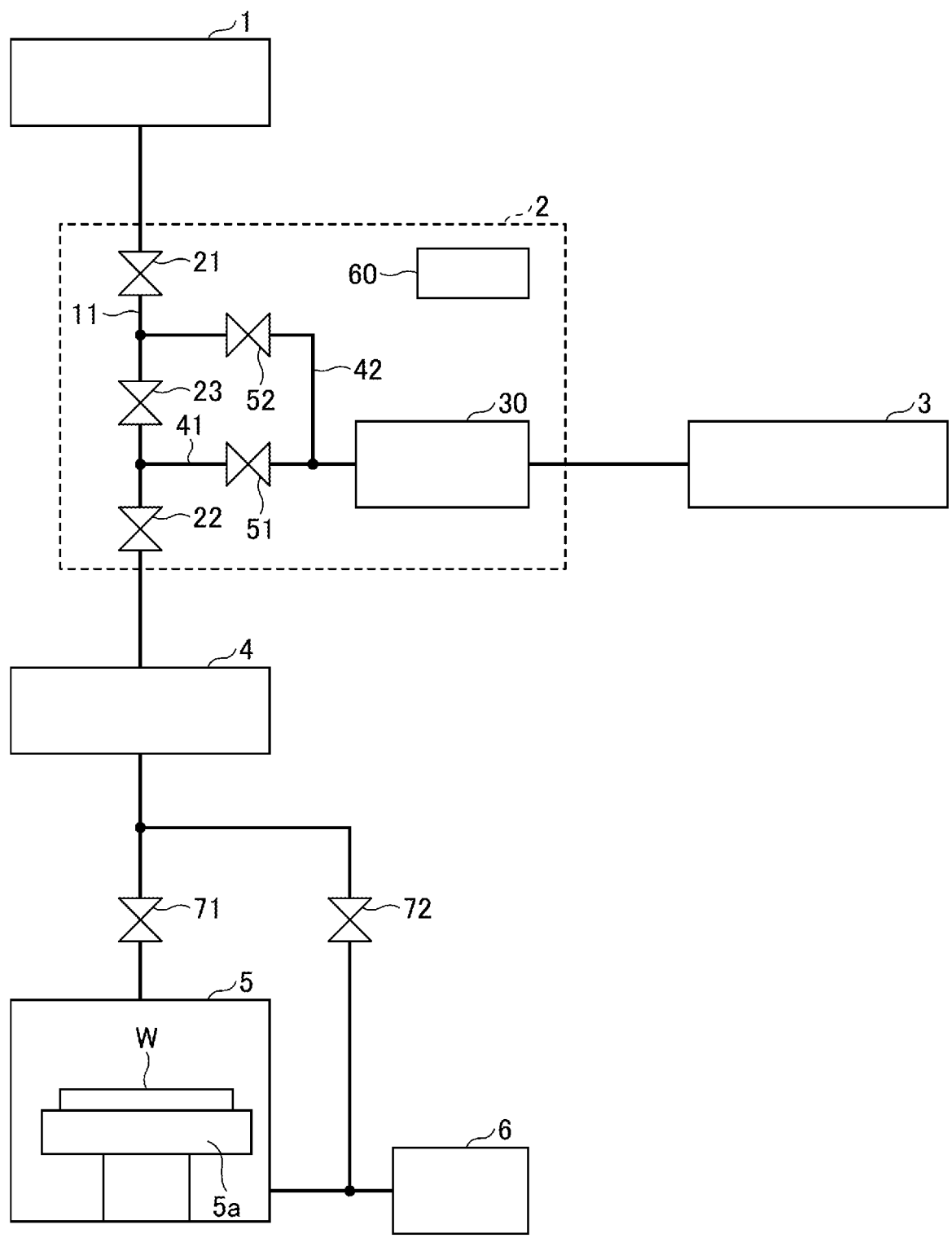
FIG. 1 is a configuration diagram of a substrate processing system including a powder transfer apparatus according to a first embodiment.

In the following, embodiments of the present disclosure will be described with reference to the accompanying drawings. In all the accompanying drawings, the same reference numerals shall be attached to the same components and overlapping descriptions may be omitted.

First Embodiment

A substrate processing system including a powder transfer apparatus 2 according to a first embodiment will be described with reference to FIG. 1. FIG. 1 is an example of a configuration diagram of the substrate processing system including the powder transfer apparatus 2 according to the first embodiment. The substrate processing system includes a powder raw material supply source 1, a powder transfer apparatus 2, a purge gas supply source 3, a vaporizer 4, a process container 5, and an exhaust apparatus 6. The substrate processing system supplies a powder raw material to the vaporizer 4 from the powder raw material supply source 1 through the powder transfer apparatus 2. In the substrate processing system, the vaporizer 4 vaporizes the powder raw material and supplied the vaporized raw material gas to the process container 5, thereby applying a desired process (for example, deposition process) to a substrate W in the process container 5. The powder raw material supply source 1, the powder transfer apparatus 2, and the vaporizer 4 serve as a gas supply apparatus that supplies the raw material gas to the process container 5.

The powder raw material supply source 1 stores the powder raw material. Further, the powder raw material supply source 1 feeds (extrudes) the powder raw material to the powder transfer pipe 11 of the powder transfer apparatus 2.

The powder transfer apparatus 2 includes the powder transfer pipe 11, a first valve 21, a second valve 22, a third valve 23, a buffer tank 30, a first purge gas supply pipe 41, a second purge gas supply pipe 42, a first purge gas valve 51, a second purge gas valve 52, and a control apparatus 60.

One end of the powder transfer pipe 11 is connected to the powder raw material supply source 1 and the other end of the powder transfer pipe 11 is connected to the vaporizer 4. The powder raw material fed from the powder raw material supply source 1 to the powder transfer pipe 11 is supplied to the vaporizer 4 by being transferred through the powder transfer pipe 11 by gravity acting on the powder raw material. Thereby, the powder transfer pipe 11 serves as a powder raw material transfer path for transferring the powder raw material from the powder raw material supply source 1 to the vaporizer 4.

The powder transfer pipe 11 is provided with the first valve 21 and the second valve 22 for opening and closing the flow path of the powder transfer pipe 11. In other words, the first valve 21 is provided on the powder transfer pipe 11, which is a secondary pipe of the powder raw material supply source 1. The second valve 22 is provided on the powder transfer pipe 11, which is a primary pipe of the vaporizer 4. The first valve 21 is provided on the upstream side relative to the second valve (on the side of the powder raw material supply source 1). The second valve 22 is provided on the downstream side relative to the first valve 21 (on the side of the vaporizer 4).

The first valve 21 is provided closer to the powder raw material supply source 1 on the powder transfer pipe 11 than a branch point (first branch point) between the powder transfer pipe 11 and the first purge gas supply pipe 41 is. The second valve 22 is provided closer to the vaporizer 4 on the powder transfer pipe 11 than the branch point (first branch point) between the powder transfer pipe 11 and the first purge gas supply pipe 41 is. The first valve 21 is provided closer to the powder raw material supply source 1 on the powder transfer pipe 11 than a branch point (second branch point) between the powder transfer pipe 11 and the second purge gas supply pipe 42 is. The second valve 22 is provided closer to the vaporizer 4 on the powder transfer pipe 11 than the branch point (second branch point) between the powder transfer pipe 11 and the second purge gas supply pipe 42 is.

The first valve 21 is a valve that can be opened and closed, and for example, a ball valve can be used. The second valve 22 and the third valve 23 are valves of which the opening degree is adjustable, and for example, a diaphragm valve (see FIG. 2, which will be described later) can be used. The first valve 21 may be a valve of which the opening degree is adjustable similar to the second valve 22 and the third valve 23.

Also, the powder transfer pipe 11 is provided with the third valve 23 for opening and closing the flow path of the powder transfer pipe 11. The third valve 23 is provided between the first valve 21 and the second valve 22. The third valve 23 is provided between the branch point (the second branch point), which is between the powder transfer pipe 11 and the second purge gas supply pipe 42, and the branch point (the first branch point), which is between the powder transfer pipe 11 and the first purge gas supply pipe 41.

The valves 21 to 23 disposed in the powder transfer pipe 11 have a valve body (not illustrated) and a valve seat (not illustrated). When the valve body is separated apart from the valve seat, the flow path is opened and the valves 21 to 23 are opened. When the valve body is in close contact with the valve seat, the flow path is closed and the valves 21 to 23 are closed.

The purge gas supply source 3 supplies a purge gas to the buffer tank 30. The buffer tank 30 is supplied with the purge gas from the purge gas supply source 3 and is filled the purge gas with high pressure (e.g., 0.1 MPa to 0.3 MPa). For example, $N_2$ gas may be used as the purge gas.

One end of the first purge gas supply pipe 41 is connected to the powder transfer pipe 11 at the branch point (the first branch point) on the upstream side (between the third valve 23 and the second valve 22) relative to the second valve 22, and the other end of the first purge gas supply pipe 41 is connected to the buffer tank 30. Thereby, the first purge gas supply pipe 41 serves as a first purge gas supply path for supplying the purge gas from the buffer tank 30 to the powder transfer pipe 11. The first purge gas supply pipe 41 is provided with a first purge gas valve 51 that opens and closes the flow path of the first purge gas supply pipe 41.

One end of the second purge gas supply pipe 42 is connected to the powder transfer pipe 11 at the branch point (the second branch point) on the upstream side (between the first valve 21 and the third valve 23) relative to the third valve 23, and the other end of the second purge gas supply pipe 42 is connected to the buffer tank 30. Thereby, the second purge gas supply pipe 42 serves as a second purge gas supply path for supplying the purge gas from the buffer tank 30 to the powder transfer pipe 11. The second purge gas supply pipe 42 is provided with a second purge gas valve 52 that opens and closes the flow path of the second purge gas supply pipe 42.

The purge gas valves 51 to 52 are at least openable and closable valves. The purge gas valves 51 to 52 may also be a valve of which the opening degree is adjustable.

The control apparatus 60 controls the opening and closing and the opening degree of the valves 21 to 23 and the purge gas valves 51 to 52.

The vaporizer 4 is supplied with the powder raw material from the powder transfer pipe 11 as a primary pipe. The vaporizer 4 has a heating section (not illustrated) such as a heater for heating the powder raw material. The vaporizer 4 heats and vaporizes the powder raw material to make a raw material gas. The vaporizer 4 has a filter (not illustrated) for collecting the powder raw material. This prevents the powder raw material from flowing into the process container 5 via the secondary side pipe of the vaporizer 4.

The secondary pipe of the vaporizer 4 is connected to the process container 5 via the valve 71. Accordingly, by opening the valve 71, the raw material gas is supplied from the vaporizer 4 to the treatment container 5, and by closing the valve 71, the supply of the raw material gas to the process container 5 is cut off.

The secondary pipe of the vaporizer 4 is connected to the exhaust apparatus 6 via the valve 72. Accordingly, by opening the valve 72, the gas is evacuated from the vaporizer 4 to the exhaust apparatus 6, and by closing the valve 72, the exhaust of the gas to the exhaust apparatus 6 is cut off.

The process container 5 includes a mounting section 5a on which a substrate W is mounted. The inside of the process container 5 can be depressurized by the exhaust apparatus 6. By supplying the raw material gas from the vaporizer 4 into the process container 5, a desired process is applied to the substrate W mounted on the mounting section 5a.

The exhaust apparatus 6 is connected to the process container 5 and depressurizes the inside of the process container 5. The exhaust apparatus 6 is connected to the vaporizer 4 and depressurizes the inside of the vaporizer 4.

Figure 2:
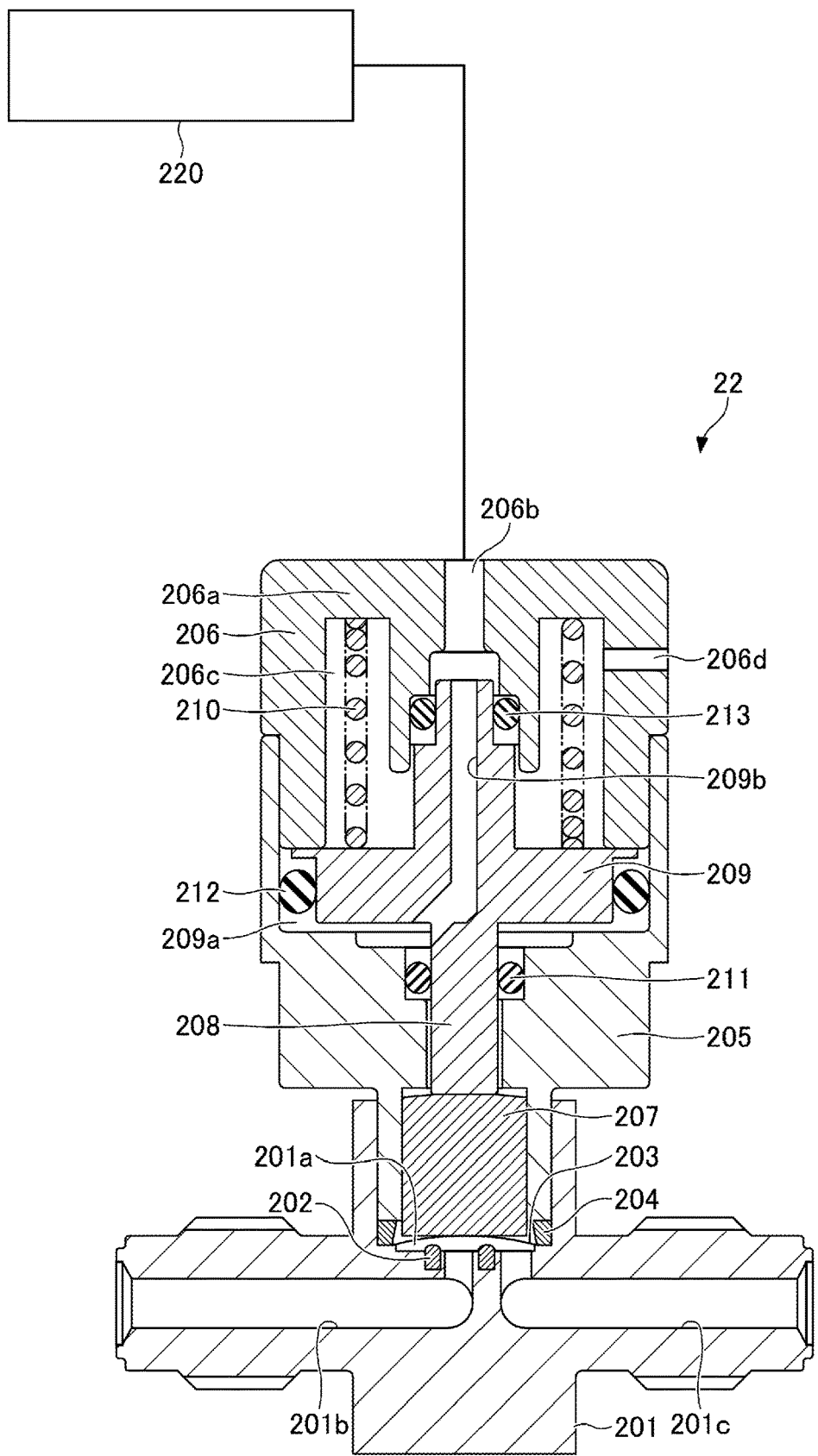
FIG. 2 is an example of a partial cross-sectional view of a second valve.

Here, the second valve 22 and the third valve 23 will be further described with reference to FIG. 2. FIG. 2 is an example of a partial cross-sectional view of the second valve 22. The configuration of the third valve is similar to that of the second valve 22, and overlapping explanations may be omitted as appropriate.

The second valve 22 is, for example, a diaphragm valve that opens/closes when an operation air is supplied from an operation air supply section 220. The second valve 22 includes a body 201, a seat 202, a diaphragm 203, a retaining adapter 204, a bonnet 205, a cap 206, a diaphragm retainer 207, a stem 208, a piston 209, a compression coil spring 210, and O-rings 211 to 213.

A cylindrical valve chamber 201a and flow paths 201b and 201c communicating with the bottom surface of the valve chamber 201a are formed in the body 201. It should be noted that the flow path 201b is on the upstream side and the flow path 201c is on the downstream side. The bottom surface of the valve chamber 201a is provided with the annular seat 202 that is a valve seat so as to surround an opening where the flow path 201b is in communication with the valve chamber 201a. The valve chamber 201a is provided with the diaphragm 203, which is a valve body over the seat 202. The outer peripheral section of the diaphragm 203 is sandwiched by the retaining adapter 204 disposed at the lower end of the bonnet 205 and the bottom surface of the valve chamber 201a to make airtight contact. The center of the diaphragm 203 moves up and down to contact and separate from the seat 202.

The bonnet 205 has a generally cylindrical shape and is secured to the body 201 by screwing the lower end portion thereof to the body 201. The outer peripheral section of the diaphragm 203 is sandwiched by the retaining adapter 204 disposed at the lower end of the bonnet 205 and the bottom surface of the valve chamber 201a.

The cap 206 has a substantially cylindrical shape with a lid and is fixed to the bonnet 205 by screwing the lower end section of the cap 206 to the upper end section of the bonnet 205. The cap 206 has an upper lid 206a located at the upper end section. A screw hole 206b is formed in the upper lid 206a through which a pipe joint (not illustrated) is screwed. One end of an air tube (not illustrated) is connected to the pipe joint (not illustrated) and the other end of the air tube is connected to a solenoid valve unit (not illustrated) connected to an air supply source (not illustrated). The bonnet 205 and the cap 206 also form a housing space 206c for accommodating the piston 209 and the compression coil spring 210. The cap 206 is provided with an air hole 206d communicating the outside with the housing space 206c. The cap 206 is made of a metal (e.g., aluminum alloy, etc.). The bonnet 205 and the cap 206 correspond to an actuator casing.

The diaphragm retainer 207 is provided on the upper side of the diaphragm 203 on the body 201 and is supported to be movable in the vertical direction by the bonnet 205.

The stem 208 is movably supported in the vertical direction by the bonnet 205 and is configured to open and close the flow paths 201b and 201c by moving close to and away from the diaphragm 203.

The piston 209 is integrally configured with the stem 208, is provided on the upper side of the stem 208, and is supported to be movable in the vertical direction by the bonnet 205 and the cap 206. An operation air introduction chamber 209a is defined by the lower surface of the piston 209 and the upper surface of the bonnet 205. Further, the piston 209 is formed with an operation air introduction path 209b extending from the upper end thereof to the operation air introduction chamber 209a.

The compression coil spring 210 is disposed between the lower surface of the upper lid 206a and the upper surface of the piston 209 to constantly bias the piston 209 downwardly.

The O-ring 211 is interposed between the bonnet 205 and the stem 208 to guide movement of the stem 208 and piston 209 in the vertical direction. The O-ring 212 is interposed between the bonnet 205 and the piston 209 to guide movement of the stem 208 and the piston 209 in the vertical direction. Further, the O-ring 211 and the O-ring 212 seal portions other than the portion of the operation air introduction chamber 209a communicating with the operation air introduction path 209b. The O-ring 213 is interposed between the upper end of the piston 209 and the cap 206 to guide the movement of the piston 209 in the vertical direction to prevent an operation air from flowing into the space where the compression coil spring 210 is located.

The operation air supply section 220 supplies the operation air to the operation air introduction chamber 209a through the screw hole 206b and the operation air introduction path 209b.

By shutting off the supply of the operation air, the diaphragm retainer 207 is biased downwardly by the biasing force of the compression coil spring 210, the diaphragm 203 seats on the seat 202, and the second valve 22 is closed.

Further, by supplying the operation air to the operation air introduction chamber 209a, the piston 209 is lifted against the biasing force of the compression coil spring 210, the diaphragm retainer 207 is lifted, the diaphragm 203 is separated from the seat 202, and the second valve 22 is opened.

Here, assuming that the supply pressure of the gas (purge gas) supplied from the flow path 201b is Pg; the supply pressure of the operation air supplied from the operation air supply section 220 to the operation air introduction chamber 209a is Pa; the spring constant of the spring (the compression coil spring 210 and the diaphragm 203) is K; the initial compression amount of the spring is t; the area of the diaphragm at which the supply gas pressure acts is Ad; the area at which the operation air pressure of the piston 209 acts is Aa; and the valve opening degree (the amount of movement of the diaphragm 203 upward) is Δt, the relationship of the following equation (1) is obtained.

$$Ad \cdot Pg + Aa \cdot Pa = K(t + \Delta t) \tag{1}$$

That is, the supply pressure Pa of the air so as to make the valve opening degree Δt, can be expressed by the following equation (2).

$$Pa = \{K(t+\Delta t) - Ad/Pg\}/Aa \tag{2}$$

That is, the control apparatus 60 can control the opening degree of the second valve 22 by controlling the operation air supply pressure Pa of the operation air supply section 220.

Figure 3:
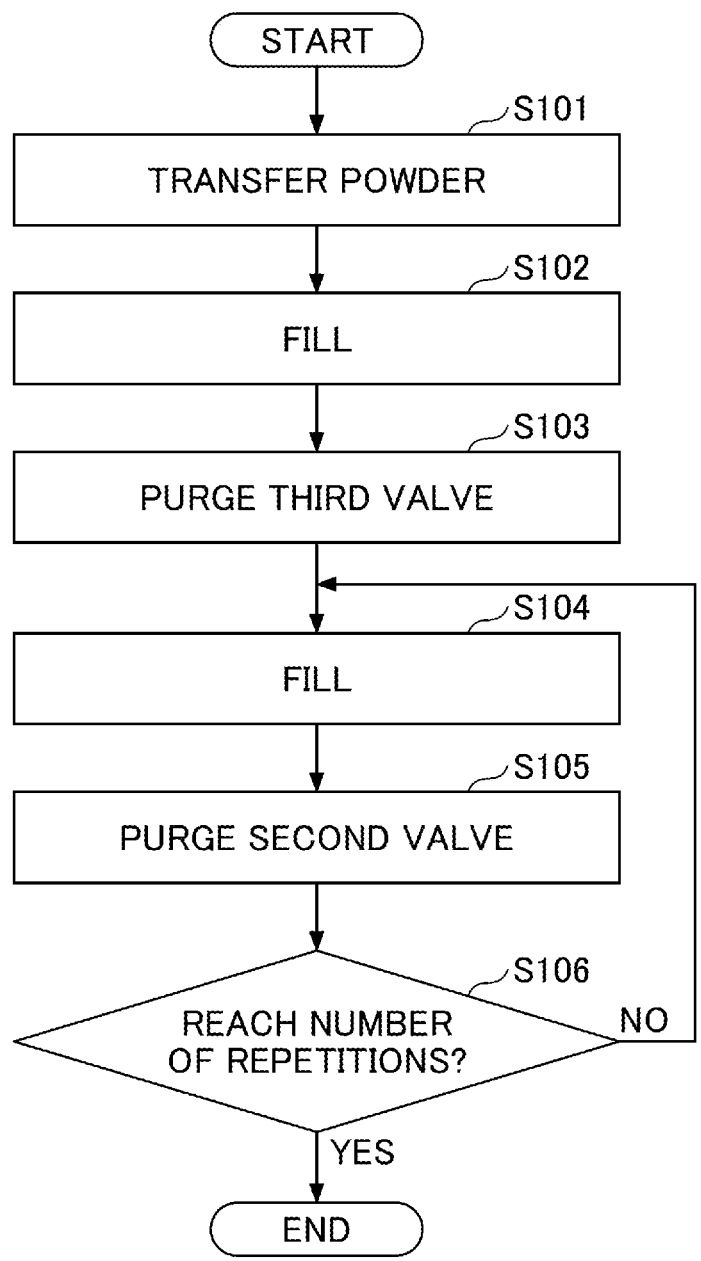
FIG. 3 is a flowchart illustrating an example of an operation of the powder transfer apparatus according to the first embodiment.

Next, an example of an operation of the powder transfer apparatus 2 will be described with reference to FIG. 3 to FIG. 8. FIG. 3 is a flowchart illustrating an example of the operation of the powder transfer apparatus 2. FIG. 4 to FIG. 8 are diagrams illustrating the opening and closing of the valves 21 to 23 and 51 to 52 and the formation of the flow path in each step. In FIG. 4 to FIGS. 8, (and FIG. 11 to FIG. 13, which will be described later), the valves in the opened state are illustrated in white, and the valves in the closed state are illustrated in black. The flow path formed by opening and closing the valves is illustrated by a thick line.

Figure 4:
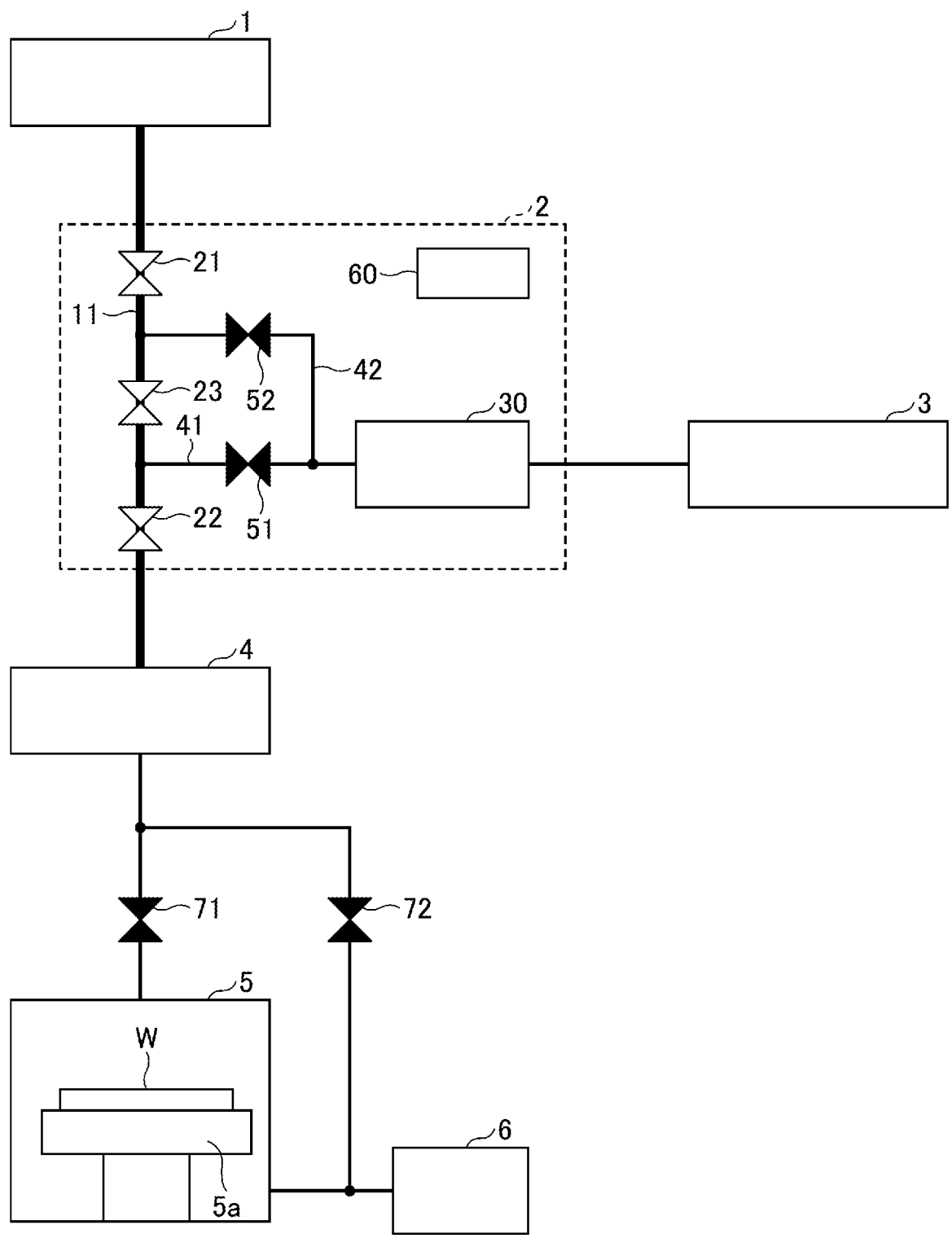
FIG. 4 is a diagram describing the opening and closing of valves and the formation of a flow path at the time of transferring a powder raw material.

In step S101, the control apparatus 60 transfers the powder raw material from the powder raw material supply source 1 to the vaporizer 4. FIG. 4 is a diagram illustrating the opening and closing of the valves and the formation of the flow path at the time of transferring the powder raw material. The control apparatus 60 opens the first valve 21, the third valve 23, and the second valve 22. The control apparatus 60 closes the first purge gas valve 51 and the second purge gas valve 52. Thereby, the powder transfer pipe 11 of the powder transfer apparatus 2 communicates the powder raw material supply source 1 with the vaporizer 4. The first purge gas supply pipe 41 and the second purge gas supply pipe 42 are closed. Here, the control apparatus 60 controls the operation air supply section 220 to fully open the opening degrees of the second valve 22 and the third valve 23.

The powder raw material fed from the powder raw material supply source 1 is transferred to the vaporizer 4 through the powder transfer pipe 11. At this time, a portion of the powder raw material adheres to the inner wall surface of the powder transfer pipe 11, the surface of the valve seat, the valve body of each of the valves 21 to 23, or the like.

Figure 5:
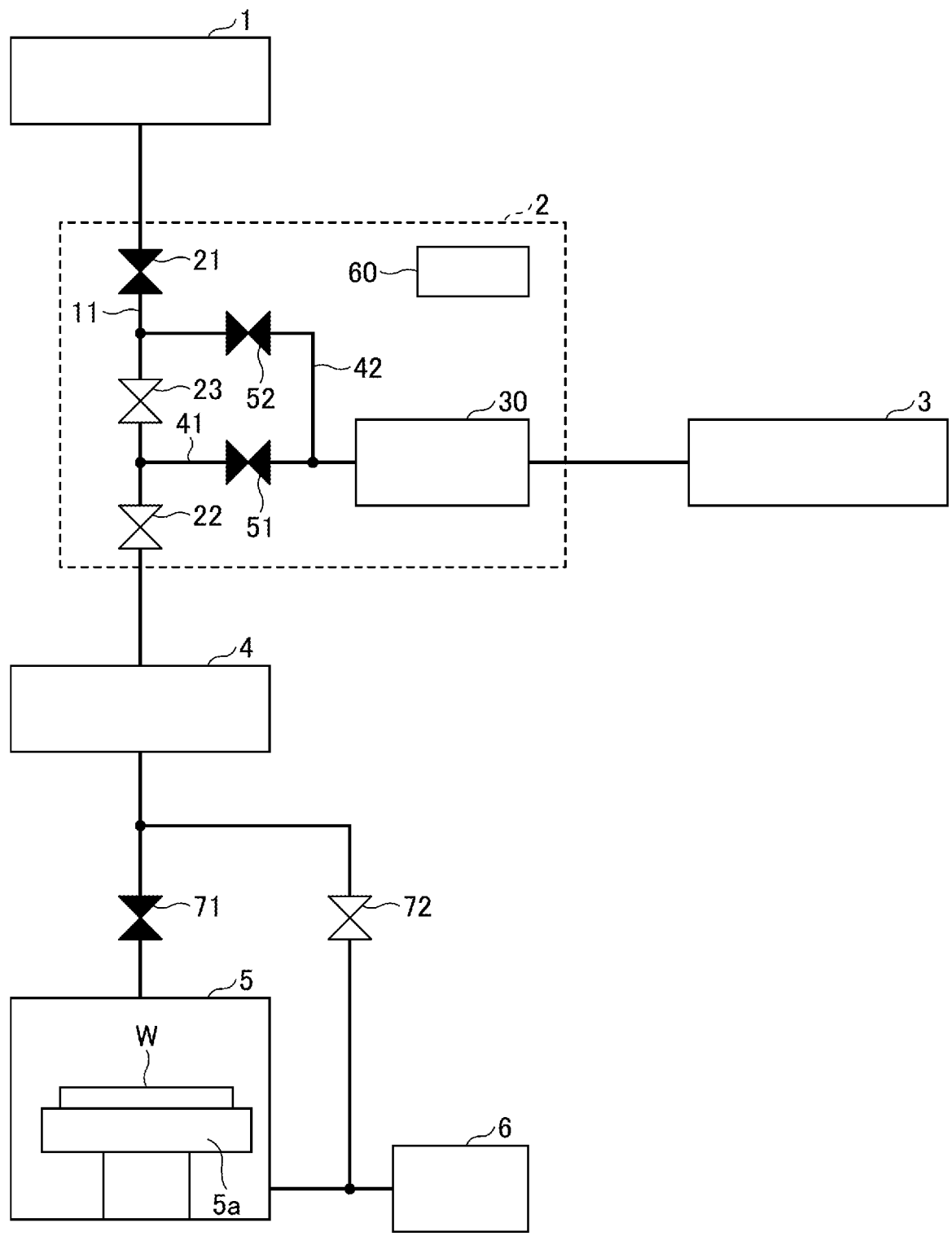
FIG. 5 is a diagram describing the opening and closing of the valves and the formation of the flow path at the time of filling a purge gas.

In step S102, the control apparatus 60 fills the buffer tank 30 with the purge gas. FIG. 5 is a diagram illustrating the opening and closing of the valves and the formation of the flow path at the time of filling with the purge gas. Here, the buffer tank 30 is filled with the purge gas prior to a purge step illustrated at step S103, which will be described later. The control apparatus 60 closes the first purge gas valve 51 and the second purge gas valve 52. Thus, the first purge gas supply pipe 41 and the second purge gas supply pipe 42 are closed. Thus, the purge gas supplied from purge gas supply source 3 is filled into the buffer tank 30. In preparation for step S103 described later, the control apparatus 60 closes the first valve 21 and opens the third valve 23 and the second valve 22. Here, the control apparatus 60 controls the operation air supply section 220 to make the opening degree of the third valve 23 to narrower than full opening. In other words, the opening degree of the third valve 23 is made narrower than the opening degree at the time of transferring the powder raw material (step S101). The control apparatus 60 may control the operation air supply section 220 to make the opening degree of the second valve 22 narrower than that when fully opened (when the powder raw material is transferred).

The buffer tank 30 may be filled with the purge gas simultaneously with step S101. In a case in which the buffer tank 30 is filled with purge gas, the process of the control apparatus 60 may proceed to step S103 without step S102.

Figure 6:
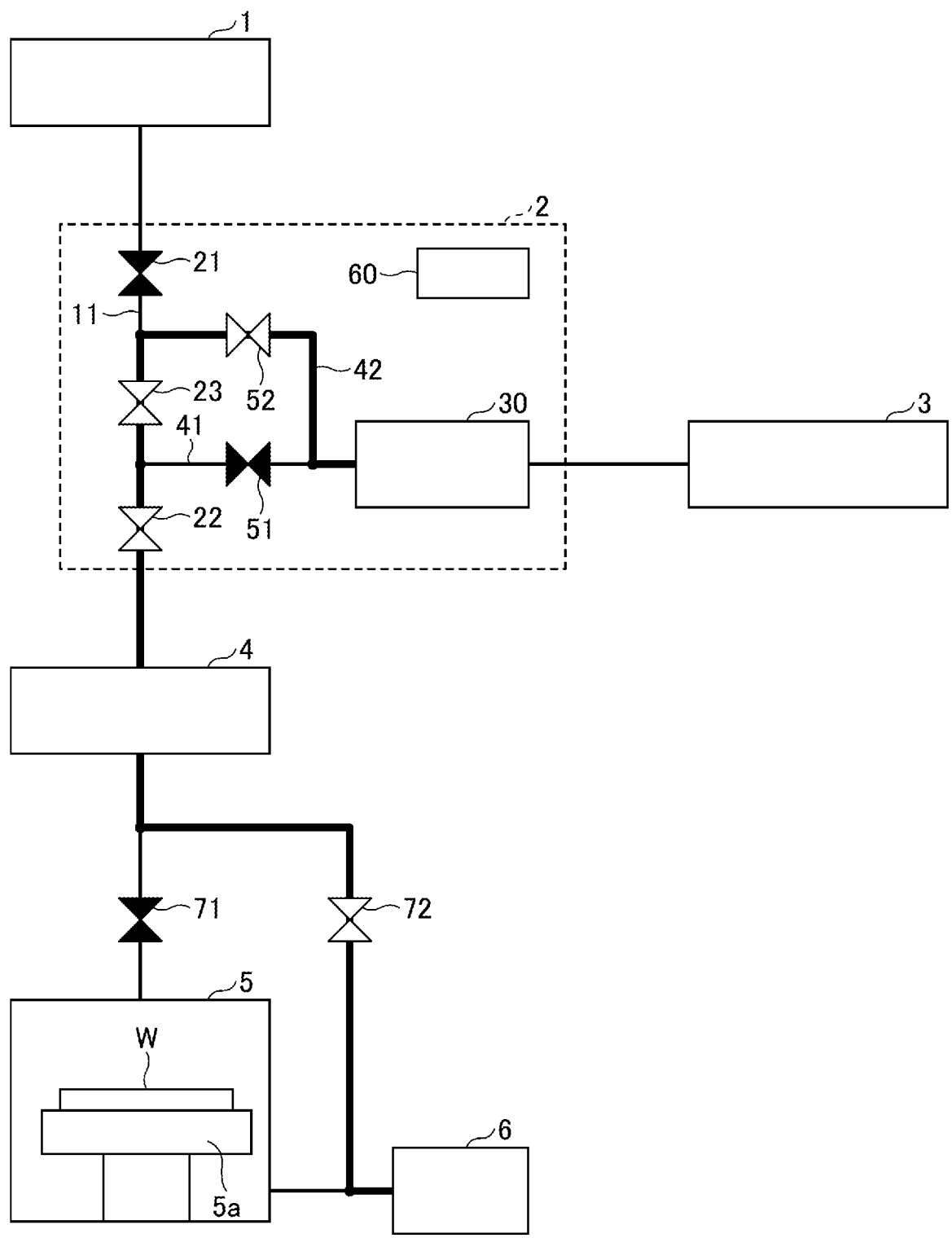
FIG. 6 is a diagram describing the opening and closing of the valves and the formation of the flow path when supplying the purge gas to a third valve.

In step S103, the control apparatus 60 supplies the purge gas to the third valve 23. FIG. 6 is a diagram illustrating the opening and closing of the valves and the formation of the flow path when the purge gas is supplied to the third valve 23. From a state in which the first valve 21, the first purge gas valve 51, and the second purge gas valve 52 are closed and the third valve 23 and the second valve 22 are opened, (see FIG. 5), the control apparatus 60 closes the second purge gas valve 52. Thereby, the second purge gas supply pipe 42 communicates with the powder transfer pipe 11.

The high pressure purge gas filled into the buffer tank 30 is supplied to the third valve 23 through the second purge gas supply pipe 42. The purge gas blows off the powder raw material remaining on the valve body (diaphragm 203), the valve seat (seat 202), and the like of the third valve 23. Also, the purge gas is supplied from the third valve 23 to the second valve 22. The purge gas blows off the powder raw material remaining on the valve body, the valve seat, and the like of the second valve 22. The purge gas and the powder raw material blown off by the purge gas flows into the vaporizer 4. The powder raw material is collected by the filter (not illustrated) of the vaporizer 4. The purge gas passes through the valve 72 and is evacuated to the exhaust apparatus 6. The first valve 21 is closed to prevent the purge gas from flowing into the powder raw material supply source 1.

Further, when the opening degree of the third valve 23 is made narrower than that when fully opened (when the powder raw material is transferred), the gap between the seat 202 and the diaphragm 203 is narrowed and the flow velocity of the purge gas is increased. This enables the powder raw material remaining on the valve body (diaphragm 203) and the valve seat (seat 202) of the third valve 23 to be suitably blown off. Therefore, when the valve body and the valve seat of the third valve 23 contact, the airtightness of the third valve 23 is improved, and it is possible to suppress leakage when the third valve 23 is closed.

Figure 7:
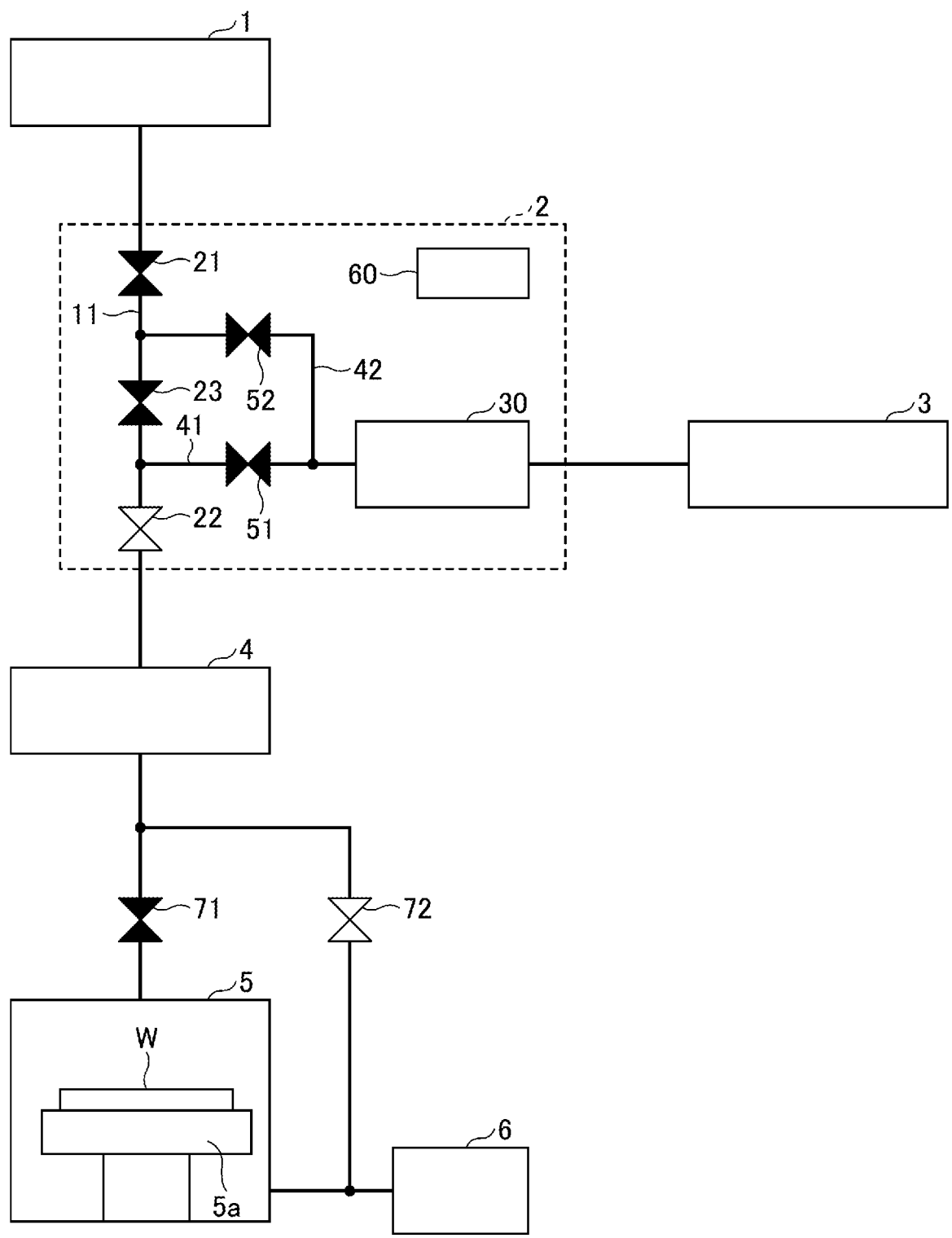
FIG. 7 is a diagram describing the opening and closing of the valves and the formation of the flow path at the time of filling with the purge gas.

In step S104, the control apparatus 60 fills the buffer tank 30 with the purge gas. FIG. 7 is a diagram illustrating the opening and closing of the valves and the formation of the flow path at the time of filling with the purge gas. Here, the purge gas is filled into the buffer tank 30 prior to the purge step illustrated in step S105, which will be described later. The control apparatus 60 closes the first purge gas valve 51 and the second purge gas valve 52. Thus, the first purge gas supply pipe 41 and the second purge gas supply pipe 42 are closed. Thus, the purge gas supplied from the purge gas supply source 3 is filled into buffer tank 30. In preparation for step S105 described later, the control apparatus 60 closes the first valve 21 and the third valve 23 and opens the second valve 22. Here, the control apparatus 60 controls the operation air supply section 220 to make the opening degree of the second valve 22 to narrower than full opening. In other words, the opening degree of the second valve 22 is made narrower than the opening degree at the time of transferring the powder raw material (step S101).

Figure 8:
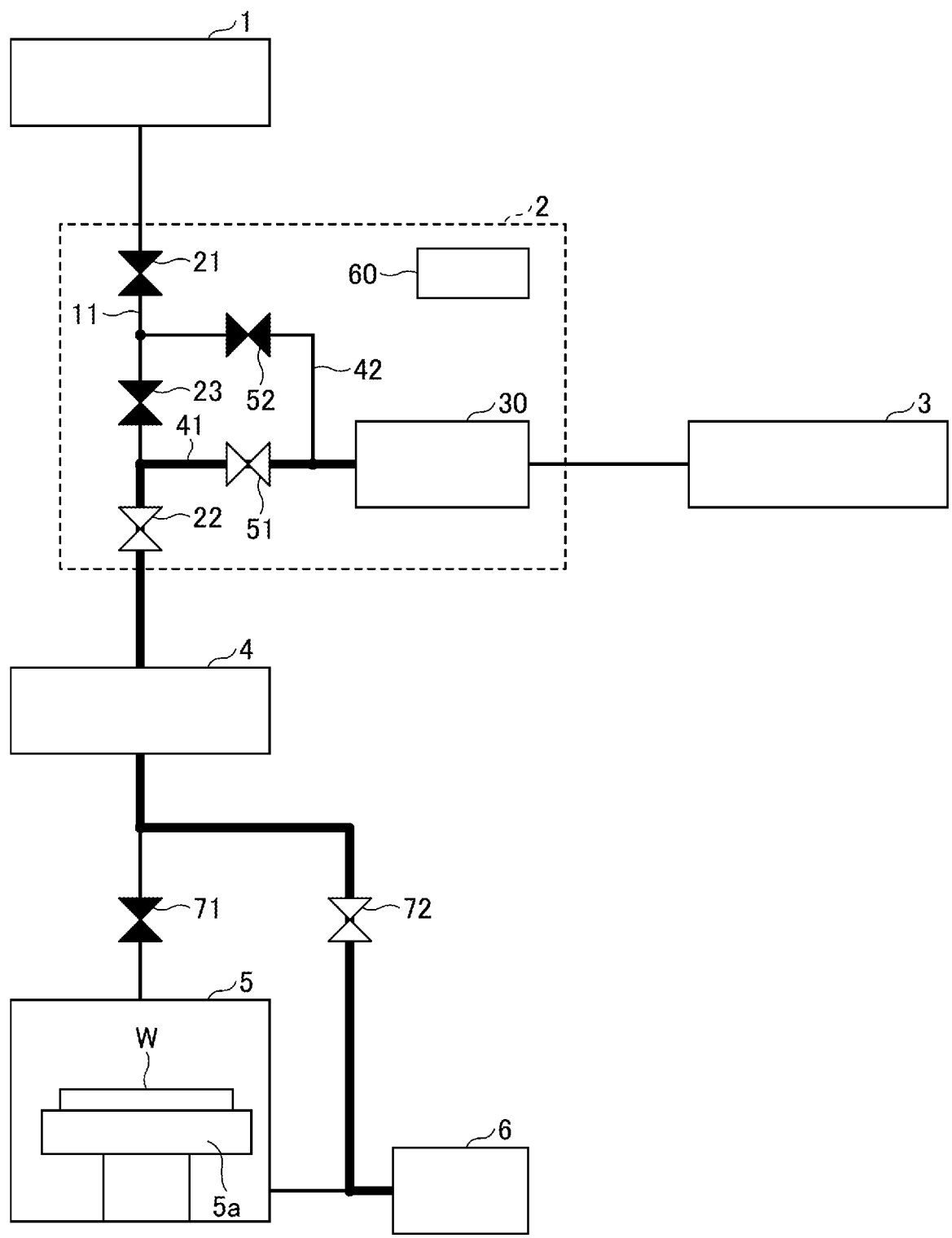
FIG. 8 is a diagram describing the opening and closing of the valves and the formation of the flow path when supplying the purge gas to the second valve.

In step S105, the control apparatus 60 supplies the purge gas to the second valve 22. FIG. 8 is a diagram illustrating the opening and closing of the valves and the formation of the flow path when the purge gas is supplied to the second valve 22. From a state in which the first valve 21, the third valve 23, the first purge gas valve 51, and the second purge gas valve 52 are closed and the second valve 22 is opened (see FIG. 7), the control apparatus 60 opens the first purge gas valve 51. Thus, the first purge gas supply pipe 41 communicates with the powder transfer pipe 11.

The high-pressure purge gas filled into the buffer tank 30 is supplied to the second valve 22 through the first purge gas supply pipe 41. The purge gas blows off the powder raw material remaining on the valve body (diaphragm 203), the valve seat (seat 202), and the like of the second valve 22. The purge gas and the powder raw material blown off by the purge gas flows into the vaporizer 4. The powder raw material is collected by the filter (not illustrated) of the vaporizer 4. The purge gas passes through the valve 72 and is evacuated to the exhaust apparatus 6. The first valve 21, the third valve 23, and the second purge gas valve 52 are closed to prevent the purge gas from flowing into the powder raw material supply source 1.

Further, when the opening degree of the second valve 22 is made narrower than that when fully opened (when the powder raw material is transferred), the gap between the seat 202 and the diaphragm 203 is narrowed and the flow velocity of the purge gas is increased. This enables the powder raw material remaining on the valve body (diaphragm 203) and the valve seat (seat 202) of the second valve 22 to be suitably blown off. Therefore, when the valve body and the valve seat of the second valve 22 contact, the airtightness of the second valve 22 is improved, and it is possible to suppress leakage when the second valve 22 is closed.

In step S106, the control apparatus 60 determines whether or not the purge of the second valve 22 has reached a predetermined number of repetitions. In a case of not having reached the predetermined number of repetitions (No in S106), the process of the control apparatus 60 returns to step S104 and repeats filling the buffer tank 30 with the purge gas (S104) and purging the second valve 22 (S105). In a case of having reached the predetermined number of repetitions (Yes in S106), the control apparatus 60 closes the valves 21 to 23 and the purge gas valves 51 to 52 and ends the process.

As described above, after the vaporizer 4 is filled with the powder raw material (S101), purging of the third valve 23 (S102 and S103) and purging of the second valve 22 (S104 to S106) are performed. Before heating and vaporizing the powder raw material filled in the vaporizer 4, the inside of the vaporizer 4 is evacuated by the exhaust apparatus 6 to obtain a high vacuum.

Here, according to the powder transfer apparatus 2 according to the first embodiment, among a plurality of valves (the first valve 21, the third valve 23, and the second valve 22) provided in the powder transfer pipe 11 connected from the powder raw material supply source 1 to the vaporizer 4, it is possible to remove the powder raw material remaining in the second valve 22 closest to the vaporizer 4. Therefore, it is possible to improve the adhesion between the valve body and the valve seat of the second valve 22 and prevent internal leakage. This enables the high vacuum in the vaporizer 4.

In addition, by repeating the filling of the purge gas (S104) into the buffer tank 30 and the purging (S105) of the second valve 22, the powder raw material remaining in the inside of the second valve 22 can be removed. It is preferable that the number of repetitions be three or more. Thereby, the powder raw material remaining in the second valve 22 can be removed.

In addition, according to the powder transfer apparatus 2 according to the first embodiment, because the powder raw material remaining in the inside of the third valve 23 can be removed, it is possible to improve the adhesion between the valve body of the third valve 23 and the valve seat, thereby preventing the generation of internal leakage. Accordingly, the powder transfer pipe 11 can be securely closed by the second valve 22 and the third valve 23, thereby further preventing the occurrence of internal leakage. This enables the high vacuum in the vaporizer 4.

The purge gas filling (S102) into the buffer tank 30 and the purge (S103) of the third valve 23 may also be repeated. Thereby, the powder raw material remaining in the third valve 23 can be removed. It is preferable that the number of repetitions be three or more. Thereby, the powder raw material remaining in the third valve 23 can be removed.

In addition, as a method of checking whether or not the powder raw material remaining in the second valve and the third valve 23 is removed, an airtightness check (leak check) of the second valve 22 and the third valve 23 may be performed. The airtightness check of the second valve 22 and the third valve 23 is performed after the purge (S105) of the second valve 22. As a method of airtightness check, first, the control apparatus 60 opens the first purge gas valve 51 in a state of closing the second valve 22 and the third valve 23. Therefore, the purge gas is supplied from the buffer tank 30 through the first purge gas valve 51 to the powder transfer pipe 11 between the second valve 22 and the third valve 23. The control apparatus 60 then closes the first purge gas valve 51. Thus, purge gas is filled into the powder transfer pipe 11 between the second valve 22 and the third valve 23. Next, the control apparatus 60 checks the pressure fluctuation of a gauge pressure gauge (not illustrated) installed between the second valve 22 and the third valve 23 of the powder transfer pipe 11. In a case in which a pressure fluctuation is not present within a predetermined period of time or the pressure fluctuation is within a predetermined range, the control apparatus 60 determines that the powder raw material remaining in the second valve 22 and the third valve 23 has been removed and completes the powder removal process.

The airtight check (leakage check) may be performed after each purging of the second valve 22 and the third valve or may be performed after purging is performed multiple times (three or more times).

Further, it has been described that the opening degree of the purge gas valves 51 to 52 is constant at the time of purging in step S103 and step S105, but the present disclosure is not limited to this. By controlling the opening degree of the purge gas valves 51 to 52, the pressure Pg of the purge gas supplied to the valves 22 and 23 may be gradually increased or may be pulsed. This improves the cleaning effect. At this time, the control apparatus 60 may control the valve opening degree Δt to be kept constant by adjusting the pressure Pa of the operation air in accordance with the pressure Pg of the purge gas based on the aforementioned relational expression (2). This enables the cleaning effect to be stabilized.

Second Embodiment

Figure 9:
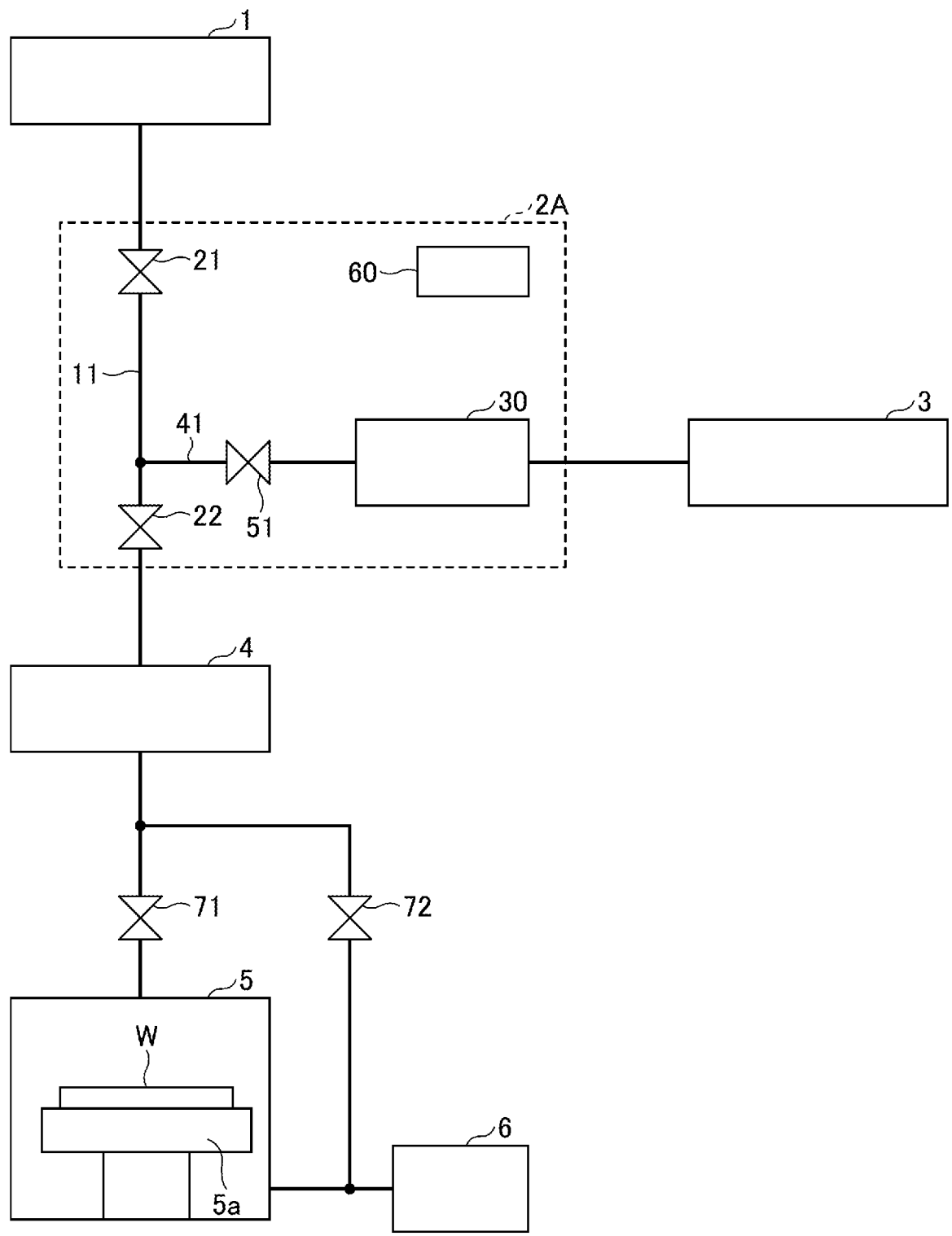
FIG. 9 is a configuration diagram of a substrate processing system including a powder transfer apparatus according to a second embodiment.

Next, a substrate processing system including a powder transfer apparatus 2A according to a second embodiment will be described with reference to FIG. 9. FIG. 9 is an example of a configuration diagram of the substrate processing system including the powder transfer apparatus 2 according to the second embodiment. The substrate processing system according to the second embodiment (see FIG. 9) differs from the substrate processing system according to the first embodiment (see FIG. 1) in including the powder transfer apparatus 2A instead of the powder transfer apparatus 2.

The powder transfer apparatus 2A includes a powder transfer pipe 11, a first valve 21, a second valve 22, a buffer tank 30, a first purge gas supply pipe 41, a first purge gas valve 51, and a control apparatus 60. That is, the powder transfer apparatus 2A differs from the powder transfer apparatus 2 in that the third valve 23, the second purge gas supply pipe 42, and the second purge gas valve 52 are omitted compared to the powder transfer apparatus 2 (see FIG. 1). The other configurations are the same, and overlapping descriptions are omitted.

Figure 10:
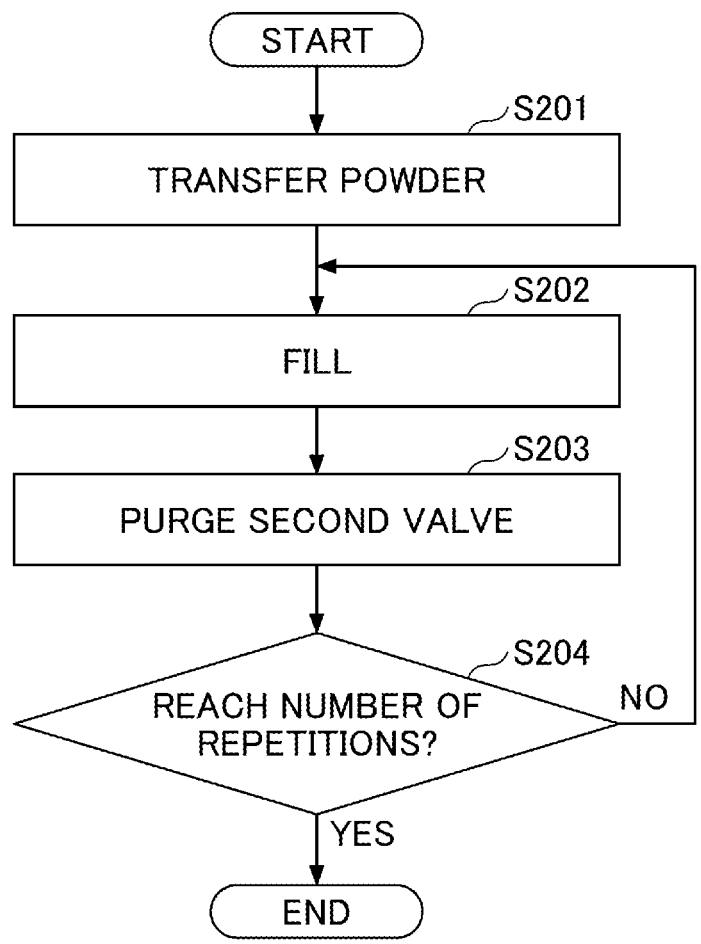
FIG. 10 is a flowchart illustrating an example of an operation of the powder transfer apparatus according to the second embodiment.
Figure 11:
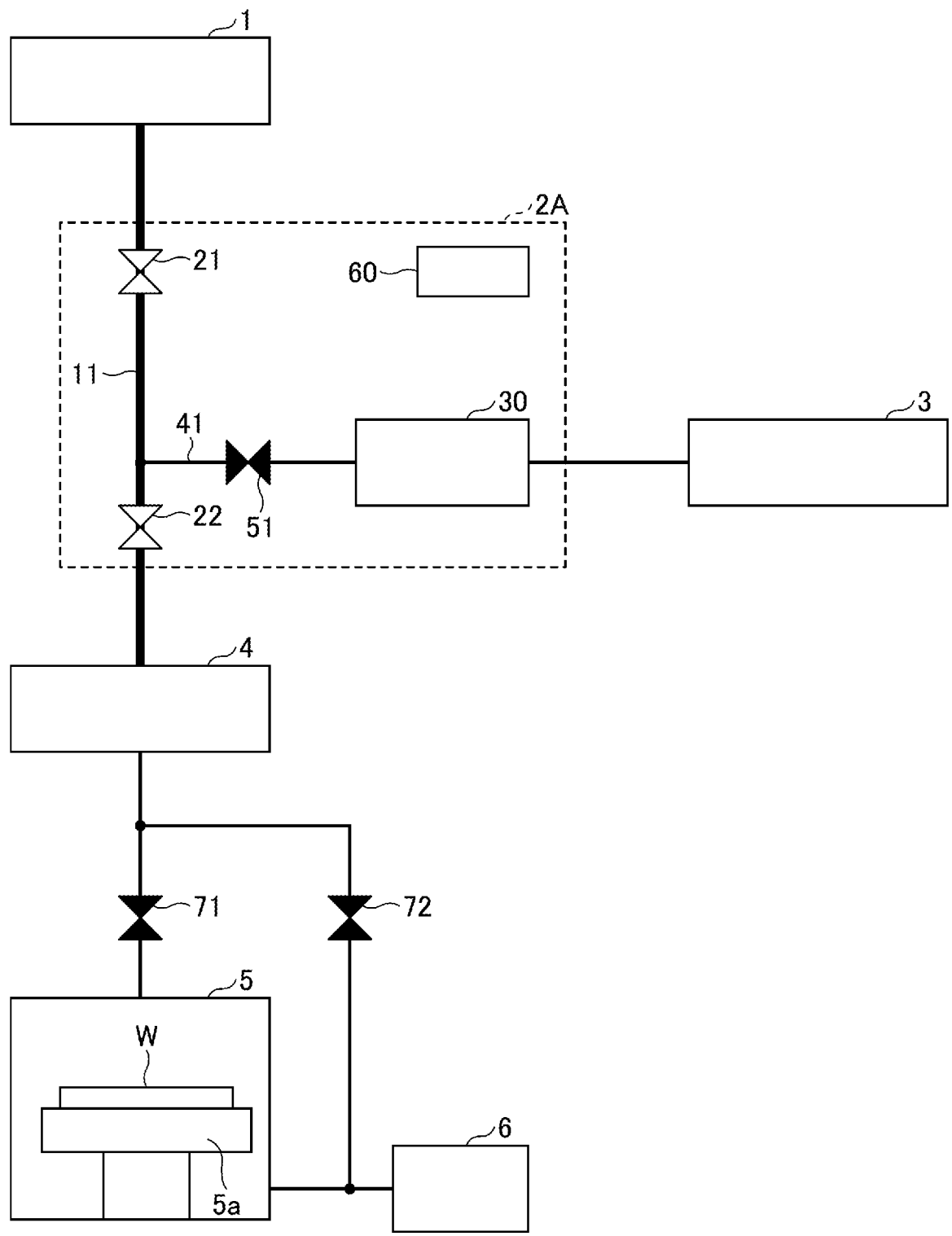
FIG. 11 is a diagram describing the opening and closing of valves and the formation of a flow path at the time of transferring a powder raw material.
Figure 12:
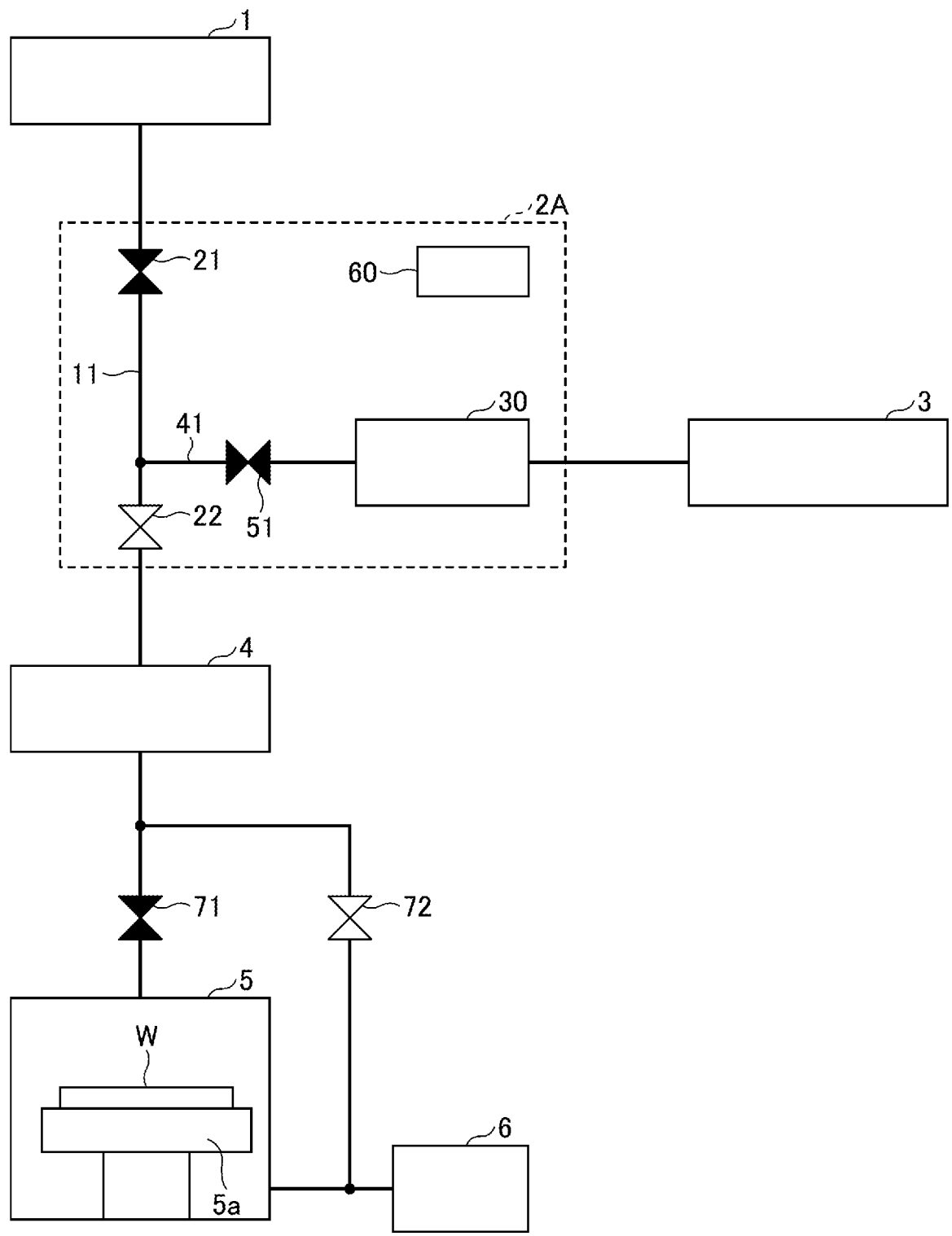
FIG. 12 is a diagram describing the opening and closing of the valves and the formation of the flow path at the time of filling a purge gas.
Figure 13:
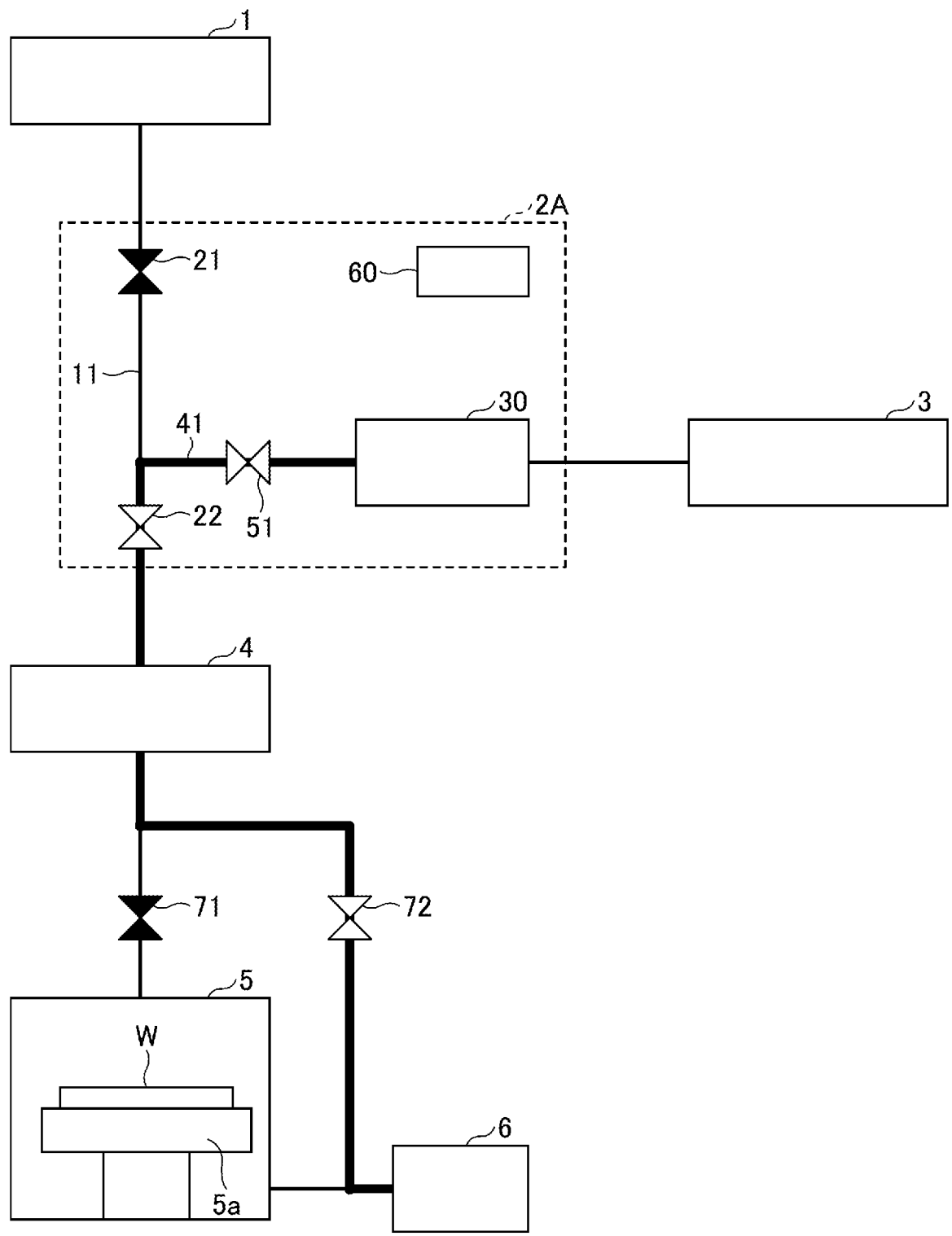
FIG. 13 is a diagram describing the opening and closing of the valves and the formation of the flow path when supplying the purge gas to a second valve.

Next, an example of an operation of the powder transfer apparatus 2 will be described with reference to FIG. 10 to FIG. 13. FIG. 10 is a flowchart illustrating an example of the operation of the powder transfer apparatus 2. FIG. 11 to FIG. 13 are diagrams illustrating the opening and closing of the valves 21 to 23 and 51 to 52 and the formation of the flow path in each step.

In step S201, the control apparatus 60 transfers the powder raw material from the powder raw material supply source 1 to the vaporizer 4. FIG. 11 is a diagram illustrating the opening and closing of the valves and the formation of the flow path at the time of transferring the powder raw material. The control apparatus 60 opens the first valve 21 and the second valve 22. The control apparatus 60 opens the first purge gas valve 51. Therefore, the powder transfer pipe 11 of the powder transfer apparatus 2 communicates the powder raw material supply source 1 with the vaporizer 4. Also, the first purge gas supply pipe 41 is closed.

The powder raw material fed from the powder raw material supply source 1 is transferred to the vaporizer 4 through the powder transfer pipe 11. At this time, a portion of the powder raw material adheres to the inner wall surface of the powder transfer pipe 11, the surface of the valve seat, the valve body of each of the valves 21 to 22, or the like.

In step S202, the control apparatus 60 fills the buffer tank 30 with the purge gas. FIG. 12 is a diagram illustrating the opening and closing of the valves and the formation of the flow path at the time of filling with the purge gas. Here, the buffer tank 30 is filled with the purge gas prior to the purge step illustrated in step S203, which will be described later. The control apparatus 60 closes the first purge gas valve 51. This closes the first purge gas supply pipe 41. Thus, the purge gas supplied from the purge gas supply source 3 is filled into the buffer tank 30. In preparation for step S203 described later, the control apparatus 60 closes the first valve 21 and opens the second valve 22. Here, the control apparatus 60 controls the operation air supply section 220 to make the opening degree of the second valve 22 to narrower than full opening. In other words, the opening degree of the second valve 22 is made narrower than the opening degree at the time of transferring the powder raw material (step S201).

In step S203, the control apparatus 60 supplies the purge gas to the second valve 22. FIG. 13 is a diagram illustrating the opening and closing of the valves and the formation of the flow path when supplying the purge gas to the second valve 22. From a state in which the first valve 21 and the first purge gas valve 51 are closed and the second valve 22 is opened (see FIG. 12), the control apparatus 60 opens the first purge gas valve 51. Thus, the first purge gas supply pipe 41 communicates with the powder transfer pipe 11.

The high-pressure purge gas filled into the buffer tank 30 is supplied to the second valve 22 through the first purge gas supply pipe 41. The purge gas blows off the powder raw material remaining on the valve body (diaphragm 203), the valve seat (seat 202), and the like of the second valve 22. The purge gas and the powder raw material blown off by the purge gas flows into the vaporizer 4. The powder raw material is collected by the filter (not illustrated) of the vaporizer 4. The purge gas passes through the valve 72 and is evacuated to the exhaust apparatus 6. The first valve 21 is closed to prevent the purge gas from flowing into the powder raw material supply source 1.

Further, when the opening degree of the second valve 22 is made narrower than that when fully opened (when the powder raw material is transferred), the gap between the seat 202 and the diaphragm 203 is narrowed and the flow velocity of the purge gas is increased. Thereby, the purge gas suitably blows off the powder raw material remaining on the valve body (diaphragm 203), the valve seat (seat 202), and the like of the second valve 22. Therefore, when the valve body and the valve seat of the second valve 22 contact, the airtightness of the second valve 22 is improved, and it is possible to suppress leakage when the second valve 22 is closed.

In step S204, the control apparatus 60 determines whether or not the purge of the second valve 22 has reached a predetermined number of repetitions. In a case of not having reached the predetermined number of repetitions (No in S204), the process of the control apparatus 60 returns to step S202 and repeats filling the buffer tank 30 with the purge gas (S202) and purging the second valve 22 (S203). In a case of having reached the predetermined number of repetitions (Yes in S204), the control apparatus 60 closes the valves 21 and 22 and the purge gas valve 51 and ends the process.

As described above, after the vaporizer 4 is filled with the powder raw material (S201), purging of the second valve 22 (S202 to S204) is performed. Before heating and vaporizing the powder raw material filled in the vaporizer 4, the inside of the vaporizer 4 is evacuated by the exhaust apparatus 6 to obtain a high vacuum.

Here, according to the powder transfer apparatus 2 according to the second embodiment, among a plurality of valves (the first valve 21 and the second valve 22) provided in the powder transfer pipe 11 connected from the powder raw material supply source 1 to the vaporizer 4, it is possible to remove the powder raw material remaining in the second valve 22 closest to the vaporizer 4. Therefore, it is possible to improve the adhesion between the valve body and the valve seat of the second valve 22 and prevent internal leakage. This enables the high vacuum in the vaporizer 4.

As described above, the powder transfer apparatuses according to the first to second embodiments have been described. However, the present disclosure is not limited to the above-described embodiments, and various modifications and improvements can be made within the scope of the present disclosure as recited in claims.

The second valve 22 and the third valve 23 have been described as being diaphragm valves (see FIG. 2), but are not limited thereto. Each of the second valve 22 and the third valve 23 may be a valve of which the opening degree is adjustable, e.g., a gate valve or a ball valve.

Also, the valves 21 to 23 and the purge gas valves 51 to 52 may be diaphragm valves (see FIG. 2).

What is claimed is:

1. A powder transfer apparatus, operable in conjunction with a powder raw material supply source and a vaporizer, the apparatus comprising:
   a powder transfer pipe configured to connect the powder raw material supply source to the vaporizer and configured to supply lithe powder from the powder raw material supply source to the vaporizer;
   a first purge gas supply pipe configured to connect a buffer tank to the powder transfer pipe at a first branch point and configured to supply a purge gas from the buffer tank to the powder transfer pipe;
   a first valve that is closer to the powder raw material supply source than the first branch point of the powder transfer pipe is;

a second valve that is closer to the vaporizer than the first branch point of the powder transfer pipe is, an opening degree of the second valve being adjustable;

a first purge gas valve provided on the first purge gas supply pipe; and a controller configured to control opening and closing of the first valve, the second valve, and the first purge gas valve, wherein the controller is configured to execute
transferring the powder from the powder raw material supply source to the vaporizer by opening the first valve and the second valve and closing the first purge gas valve;

filling the buffer tank with the purge gas by closing the first purge gas valve; and supplying the purge gas to the second valve by closing the first valve and opening the second valve and the first purge gas valve, wherein the opening degree of the second valve in the supplying the purge gas is narrower than the opening degree of the second valve in the transferring the powder.

2. The powder transfer apparatus according to claim 1, wherein the second valve is a diaphragm valve, and
wherein the controller is configured to control the opening degree of the second valve by controlling an operation air pressure supplied to the second valve.

3. The powder transfer apparatus according to claim 2, wherein the controller is configured to control the operation air pressure based on a relational expression $Pa=\{K(t+\Delta t)-Ad/Pg\}/Aa$,
where a purge gas pressure is $Pg$; the operation air pressure is $Pa$; a spring constant of a spring that biases a diaphragm is $K$; an initial compression amount of the spring is $t$; an area of the diaphragm at which the purge gas pressure acts is $Ad$; an area where the operation air pressure acts on a piston is $Aa$; the piston contacting the diaphragm and the spring; and an amount of movement of the diaphragm is $\Delta t$; the amount of movement of the diaphragm corresponding to the opening degree of the second valve.

4. The powder transfer apparatus according to claim 3, wherein the controller is configured to
vary the purge gas pressure; and
control the operation air pressure based on the relational expression.

5. A gas supply apparatus comprising:
the powder transfer apparatus according to claim 1;
a pump configured to deliver the purge gas from a source of the purge gas to the buffer tank;
the powder raw material supply source; and
the vaporizer.

* * * * *